United States Patent
Huang

(10) Patent No.: US 7,155,361 B2
(45) Date of Patent: Dec. 26, 2006

(54) SEMICONDUCTOR TEST MANAGEMENT SYSTEM AND METHOD

(75) Inventor: Joshua Huang, Changhua County (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 17 days.

(21) Appl. No.: 11/064,634

(22) Filed: Feb. 24, 2005

(65) Prior Publication Data

US 2006/0190206 A1    Aug. 24, 2006

(51) Int. Cl.
*G01R 31/00* (2006.01)

(52) U.S. Cl. .......................... 702/117; 700/121

(58) Field of Classification Search ................ 702/117
See application file for complete search history.

(56) References Cited

U.S. PATENT DOCUMENTS 6,041,270 A * 3/2000 Steffan et al. ............. 700/121
6,055,463 A * 4/2000 Cheong et al. ............ 700/223
6,319,737 B1 * 11/2001 Putnam et al. ............. 438/17

* cited by examiner

*Primary Examiner*—John Barlow
*Assistant Examiner*—Jonathan Moffat
(74) *Attorney, Agent, or Firm*—Thomas, Kayden, Horstemeyer & Risley

(57) ABSTRACT

A system and method for semiconductor test management. A second computer receives a scrap rule from a first computer, acquires an initial scrap threshold corresponding to the scrap rule, stores the scrap rule as a SBC/SBL (Statistic BIN Control/Statistic BIN Limit) rule when a scrap condition therein is less or equally restrictive than the initial scrap threshold, acquires a CP (Circuit Probing) test result for a wafer or wafer lot and generates an advisory report for the wafer or wafer lot by carrying the CP test result into the stored SBC/SBL rules.

16 Claims, 4 Drawing Sheets

| Part# | STAGE | Subject Type | Rule | Advisory |
|---|---|---|---|---|
| TCCTA7 | SORT1 | Lot | YIELD<45 | Hold for Analysis |
| TCCTA7 | SORT2 | Lot | YIELD<40 | Hold for Analysis |
| TCCTA7 | SORT1 | Wafer | YIELD<40 | Hold for Analysis |
| TCCTA7 | SORT2 | Wafer | YIELD<30 | Downgrade |
| TCCTA7 | SORT1 | Wafer | YIELD<24.7 | Scrap |
| TCCTA7 | SORT2 | Wafer | (SORT2:GOODDIE)-(SORT1:GOODDIE)/(SORT1:REPAIRDIE)<0.9 | Hold for Analysis |

SEMICONDUCTOR TEST MANAGEMENT SYSTEM AND METHOD

BACKGROUND

The invention relates to semiconductor product test technology, and more particularly, to a method and system of SBC/SBL (Statistic BIN Control/Statistic BIN Limit) rule verification for semiconductor device/product testing.

A conventional semiconductor factory typically includes fabrication tools required to process semiconductor wafers for a particular purpose, such as photolithography, chemical-mechanical polishing, or chemical vapor deposition. During manufacture, the semiconductor wafer passes through a series of process steps performed by various fabrication tools. For example, in the production of an integrated semiconductor product, the semiconductor wafer passes through up to 600 process steps. The cost of such automated production is greatly influenced by how efficiently the manufacturing process can be monitored or controlled, such that the ratio of defect-free products to the overall number of products manufactured (i.e., yield ratio) achieves the greatest possible value. The individual process steps, however, are subject to fluctuation and irregularities, which in the worst case may generate a defective number of chips or the entire wafer. Therefore, each individual process step must be carried out as stably as possible to ensure an acceptable yield after the completed processing of a wafer.

Circuit probing (CP) testing systems/methods have been used in a variety of semiconductor fabrication processes for acquiring yield data. A test program is provided by a user or operator for a CP test on a particular semiconductor product. The test program describes a test flow including multiple test items, and the test items are typically optimally arranged to reduce CP test time. A CP test station then follows the predefined test flow to sequentially probe all dies on a wafer to determine whether a die is good or bad. After completing the entire CP test, results of test attributes such as yield values, quantities of good dies, repairable dies, power short dies and the like, for wafers, wafer lots or semiconductor products, are acquired. Test-results are subsequently carried into SBC/SBL rules to generate final advisories such as acceptance, scrap, hold for analysis, downgrade and the like, for wafers, wafer lots or semiconductor products.

Prior to a CP test, SBC/SBL rules are verified and negotiated to ensure the benefit will not be damaged. For example, a more restrictive SBC/SBL rule causes more scrapping and requires further verification. Conventionally, operators spend much time communicating various SBC/SBL rules, and this labor-intensive management method severely hinders efficiency.

SUMMARY

Systems of semiconductor test management are provided. An embodiment of a system for semiconductor test management comprises a first computer and a second computer. The second computer receives a scrap rule from the first computer, acquires an initial scrap threshold corresponding to the scrap rule, determines whether a scrap condition in the scrap rule is more restrictive than the initial scrap threshold, stores the scrap rule as a SBC/SBL (Statistic BIN Control/Statistic BIN Limit) rule when the scrap condition is less or equally restrictive than the initial scrap threshold, acquires a CP (Circuit Probing) test result for a wafer or wafer lot and generates an advisory report for the wafer or wafer lot by carrying the CP test result into the stored SBC/SBL rules, enabling sorting of the wafer or wafer lot for subsequent process according to the advisory report. The scrap rule determines whether the wafer or wafer lot is to be scrapped when the CP test result for the wafer or wafer lot satisfies the scrap condition therein.

In some embodiments the second computer may receive the scrap rule via a Web server and the first computer may transmit the scrap rule via a Web browser. The second computer may receive a hold rule from the first computer and store the hold rule as a SBC/SBL rule, in which the hold rule determines whether the wafer or wafer lot is held for analysis. The second computer may receive a downgrade rule from the first computer and store the downgrade rule as a SBC/SBL rule, in which the downgrade rule determines whether the wafer or wafer lot is processed for low-end products. The second computer may reject the scrap rule when the scrap condition is more restrictive than the initial scrap threshold. The second computer may prompt a rejection message to the first computer when the scrap condition is more restrictive than the initial scrap threshold. The initial scrap threshold may be negotiated and generated during order management.

An embodiment of a system for semiconductor test management comprises a first computer and a second computer. The second computer receives a SBC/SBL rule from the first computer, determines whether the SBC/SBL rule is scrap rule, acquires an initial scrap threshold corresponding to the SBC/SBL rule when the SBC/SBL rule is scrap rule, determines whether a scrap condition in the SBC/SBL rule is more restrictive than the initial scrap threshold, stores the SBC/SBL rule when the scrap condition is less or equally restrictive than the initial scrap threshold, acquires a CP test result for a wafer or wafer lot and generates an advisory report for the wafer or wafer lot by carrying the CP test result into the stored SBC/SBL rules, enabling sorting of the wafer or wafer lot for subsequent process according to the advisory report. The scrap rule determines whether the wafer or wafer lot is scrapped when the CP test result for the wafer or wafer lot satisfies the scrap condition in the scrap rule.

In some embodiments, identification of the SBC/SBL rule as a scrap rule may be determined by detecting a final advisory or a flag therein. The second computer may determine whether the SBC/SBL rule is a hold rule or downgrade rule and, if so, store the SBC/SBL rule, in which the hold rule determines whether the wafer or wafer lot is held for analysis and the downgrade rule determines whether the wafer or wafer lot is processed for low-end products.

Methods for semiconductor test management are also provided. An embodiment of a method performed by a first computer comprises receiving a scrap rule from a second computer, acquiring an initial scrap threshold corresponding to the scrap rule, determining whether a scrap condition in the scrap rule is more restrictive than the initial scrap threshold, storing the scrap rule as one of SBC/SBL rules when the scrap condition is less or equally restrictive than the initial scrap threshold, acquiring a CP test result for a wafer or wafer lot, and generating an advisory report for the wafer or wafer lot by carrying the CP test result into the stored SBC/SBL rules, enabling sorting of the wafer or wafer lot for subsequent process according to the advisory report.

An embodiment of a method performed by a first computer comprises receiving a SBC/SBL rule from a second computer, determining whether the SBC/SBL rule is a scrap rule, acquiring an initial scrap threshold corresponding to the SBC/SBL rule when the SBC/SBL rule is the scrap rule, determining whether a scrap condition in the SBC/SBL rule is more restrictive than the initial scrap threshold, storing the SBC/SBL rule when the scrap condition is less or equally restrictive than the initial scrap threshold, acquiring a CP (Circuit Probing) test result for a wafer or wafer lot, and generating an advisory report for the wafer or wafer lot by carrying the CP test result into the stored SBC/SBL rules, enabling sorting of the wafer or wafer lot for subsequent process according to the advisory report.

BRIEF DESCRIPTION OF THE DRAWINGS

The aforementioned features and advantages of embodiments of the invention will become apparent by referring to the following detailed description of embodiments with reference to the accompanying drawings, wherein:

FIG. 3 is a diagram of exemplary SBC/SBL rules;

DESCRIPTION

Figure 1:
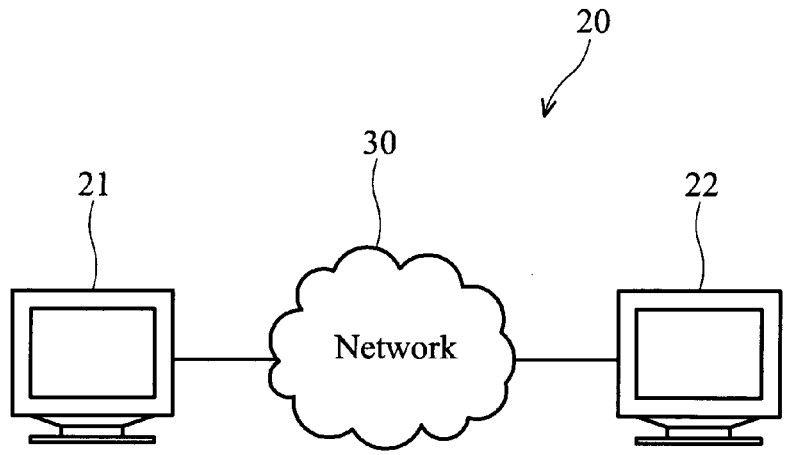
FIG. 1 is a diagram of the network architecture of an embodiment of a semiconductor test management system.

FIG. 1 is a diagram of the network architecture of an embodiment of a semiconductor test management system. The semiconductor test management system 20 comprises two computers 21 and 22. Computer 21 operates in a networked environment using logical connections to one or more remote computers, such as computer 22. When used in a LAN-networking environment, the computers 21 and 22 are connected to the local network through network interfaces or adapters. When used in a WLAN-networking environment, the computers 21 and 22 are connected to the local network through wireless network interfaces or adapters. When used in a WAN-networking environment, the computers 21 and 22 typically include ADSL modems or any other type of communication device for establishing communications over the wide area network, such as the Internet. Those skilled in the art will recognize that computers 21 and 22 may be connected in different types of networking environments, and communicate between different types of networking environments through various types of transmission devices such as routers, gateways, access points, base station systems or others.

Figure 2:
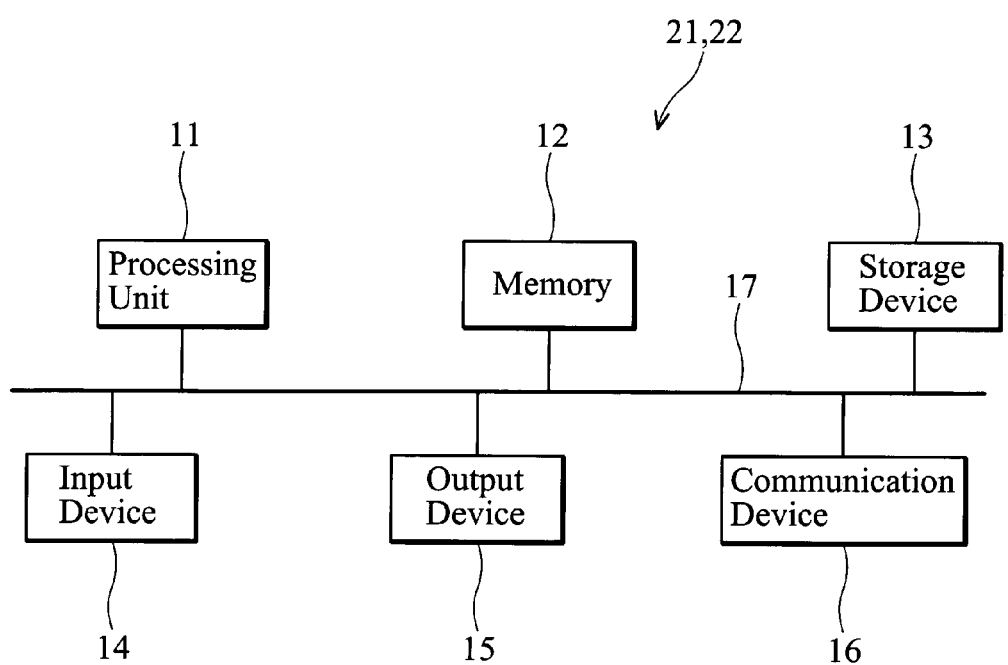
FIG. 2 is a diagram of a hardware environment applicable to computers in an embodiment of a semiconductor test management system.

FIG. 2 is a diagram of a hardware environment applicable to computers in an embodiment of a semiconductor test management system. The description of FIG. 2 provides a brief, general description of suitable computer hardware and a suitable computing environment for computers 21 and 22 in conjunction with which at least some embodiments of the invention may be implemented. The hardware environment of FIG. 2 includes a processing unit 11, a memory 12, a storage device 13, an input device 14, an output device 15 and a communication device 16. The processing unit 11 is connected by buses 17 to the memory 12, storage device 13, input device 14, output device 15 and communication device 16 based on Von Neumann architecture. There may be one or more processing units 21, such that the processor of the computer comprises a single central processing unit (CPU), a micro processing unit (MPU) or multiple processing units, commonly referred to as a parallel processing environment.

The memory 12 is preferably a random access memory (RAM), but may also include read-only memory (ROM) or flash ROM. The memory 12 preferably stores program modules executed by the processing unit 11 to perform experiment management functions. Generally, program modules include routines, programs, objects, components, or others, that perform particular tasks or implement particular abstract data types. Moreover, those skilled in the art will understand that at least some embodiments may be practiced with other computer system configurations, including hand-held devices, multiprocessor-based, microprocessor-based or programmable consumer electronics, network PCs, minicomputers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web objects, Web Services or other similar architectures. The storage device 13 may be a hard drive, magnetic drive, optical drive, a portable drive, or nonvolatile memory drive. The drives and associated computer-readable media thereof (if required) provide nonvolatile storage of computer-readable instructions, data structures, program modules, gating rules and gating rule versions (if required). The processing unit 11, controlled by program modules received from the memory 12 and from an operator through the input device, directs experiment management functions. The storage device 13 may comprise a database management system, an object base management system, a file management system, or others, for storing multiple SBC/SBL (Statistic BIN Control/Statistic-BIN Limit) rules.

FIG. 3 is a diagram of exemplary SBC/SBL rules 321 to 326. Each SBC/SBL rule determines a final advisory such as scrap, hold for analysis, downgrade, and the like, for a wafer or wafer lot when a test result for a CP test attribute, such as yield value, quantities of good dies, repairable dies, and the like, or a test result for a mathematical operation of multiple test attributes satisfies a particular condition. All SBC/SBL rules can be classified into three categories, hold, downgrade and scrap, according to final advisories therein. Alternatively, the rule classification may be expressed by particular flags stored in SBC/SBL rules, for example, "H" represents a hold rule, "S" represents a scrap rule and "N" represents a downgrade rule. A hold rule is utilized to determine whether wafers, wafer lots, semiconductor devices or semiconductor products is required to be held for further analysis. A downgrade rule is utilized to determine whether wafers or wafer lots are to be processed for low-end products, for example, CPUs with lower speed. A scrap rule is utilized to determine whether wafers or wafer lots are to be scrapped. Such SBC/SBL rules may be expressed as meta-rules (rule templates), as the maximum or minimum number of predicates that can occur in the rule antecedent or consequent, as relationships among test attributes, test attribute values, as equations comprising test attributes, and/or aggregates. For example, referring to row 321, a SBC/SBL rule may determine that a wafer lot should be held for analysis when the yield value in the first testing stage is lower than forty-five. Referring to row 324, another SBC/SBL rule may determine that a wafer should be downgraded when the yield value in the first testing stage is lower than or equal to thirty. Referring to row 326, yet another SBC/SBL rule may determine that a wafer should be held for analysis when the result of good die quantity in the first testing stage from good die quantity in the second testing stage, into repairable die quantity in the first testing stage is lower than 90 percent. Note that a wafer, wafer lot or semiconductor product may be accepted when test results satisfy no SBC/SBL rules. Those skilled in the art will appreciate that additional or different SBC/SBL rules may be provided.

Computer 21 is preferably equipped with a browser to gain access to computer 22. The web browser is a client application or, preferably, an integrated operating system utility that communicates with the computer 22. The web browser receives content from the computer 22 over the network 30, typically encoded in Hyper Text Markup Language (HTML), Extensible Markup Language (XML) or the like. The web browser typically supports additional components such as Java Applets, ActiveX Controls and Plug-Ins that provide extra functionality for submission of SBC/SBL rules.

Computer 22 is preferably equipped with a Web server to communicate with computer 21. Generally, information provided by the web server is in the form of Web pages, generally in HTML (HyperText mark-up language) format, a text-based format that describes how the respective Web page is to be displayed by computer 21, and provides textual information, typically in ASCII form, and graphical information generally in a compressed format such as "GIF" or "JPEG", to facilitate SBC/SBL rule submission and respond submission result.

Figure 4:
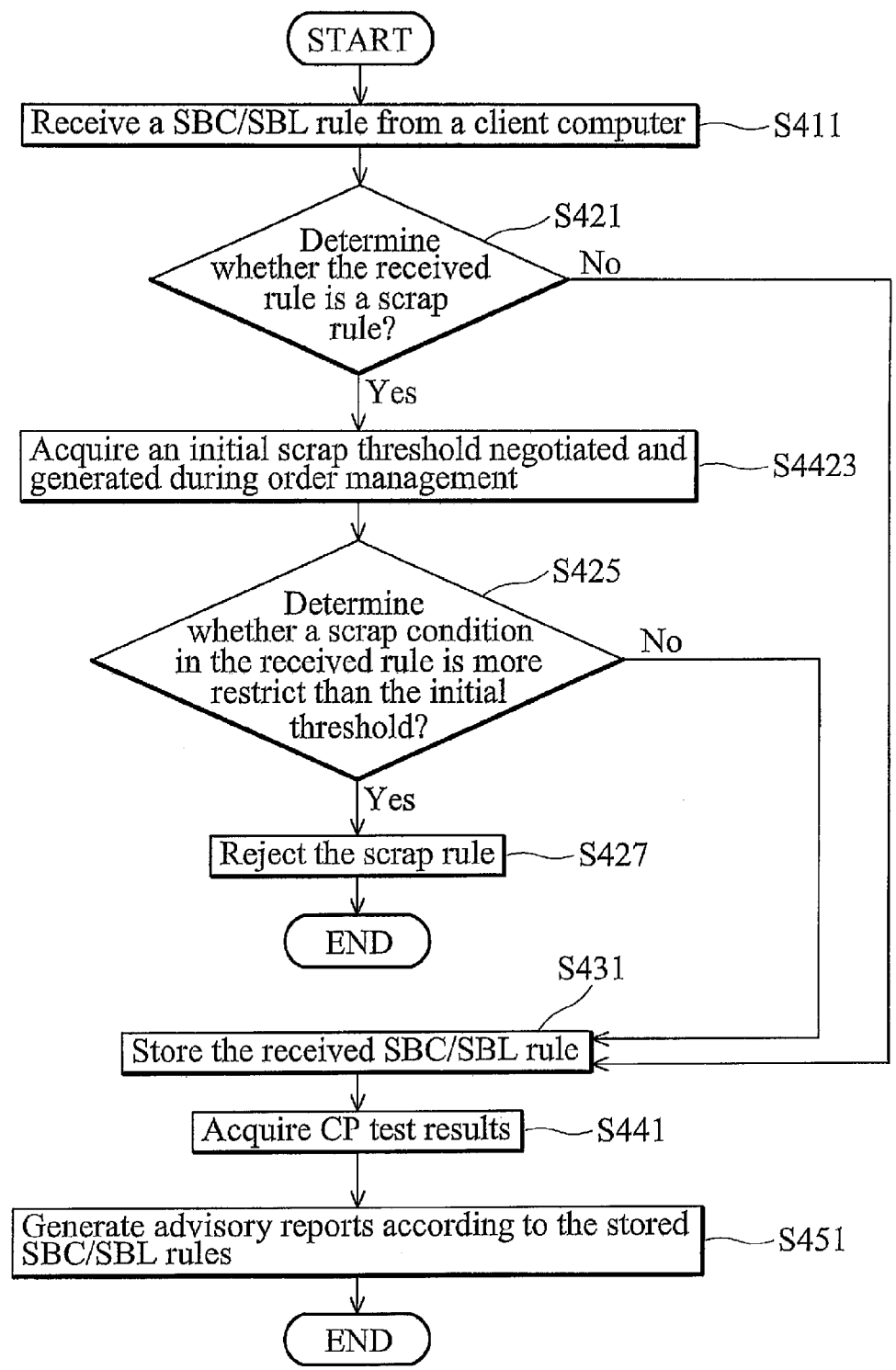
FIG. 4 is a flowchart of an embodiment of a method of semiconductor test management.

FIG. 4 is a flowchart of an embodiment of a method of semiconductor test management performed by the processing unit 11 of computer 22. In step S411, a new SBC/SBL rule is received from the computer 21. The computer 22 may provide a single interface embedded in at least one Web page to facilitate interaction with the generation and submission of the SBC/SBL rule. Alternatively, the computer 22 may import a new SBC/SBL rule from a file in a nonvolatile storage medium such as a hard disk, a floppy disk, an optical disk, a portable disk and the like, or a remote computer equipped with a designated client application instead of a Web browser. In step S421, it is determined whether the received SBC/SBL rule is a scrap rule, and, if so, the process proceeds to step S423, and otherwise, to step S431. The determination may be achieved by detecting above mentioned final advisory or flag therein. In step S423, an initial scrap threshold for the received scrap rule is acquired, which is negotiated and generated during order management. The initial scrap threshold may be stored in the storage device 13 therein or in a remote logistic management system (not shown). When stored in a remote logistic management system (not shown), the initial scrap threshold may be acquired by issuing a request command with relevant parameters such as test attribute, semiconductor product number (Part number), wafer identity, wafer lot identity or a combination of any two thereof. In step S425, it is determined whether a scrap condition in the received scrap rule is more restrictive than the initial scrap threshold, and, if so, the process proceeds to step S427, and otherwise, to step S431. For example, if the received scrap rule as shown in 325 of FIG. 3, and the initial threshold for Yield of product "TCCTA7" is 10, the received scrap condition therein is more restrictive than the initial scrap threshold. In step S427, the received scrap rule is rejected. The rejection message may be transmitted to the computer 21 and prompted via a Web browser or a client application therein. In step S431, the received SBC/SBL rule is stored in the storage device 13. The received SBC/SBL rule may be stored in one or more tables/objects in a relational database/object database. In step S441, CP (Circuit Probing) test results are acquired. The CP test results may be acquired from one or more files, relational tables, data objects or others, or from one or more CP test stations via the network 30. In step S451, advisory reports are generated by carrying the acquired CP test results into the stored SBC/SBL rules, enabling sorting of wafers or wafer lots for subsequent process such as bumping, package, final test and the like. The advisory reports are preferably formed in a digital format recognized by sorting tools.

Figure 5:
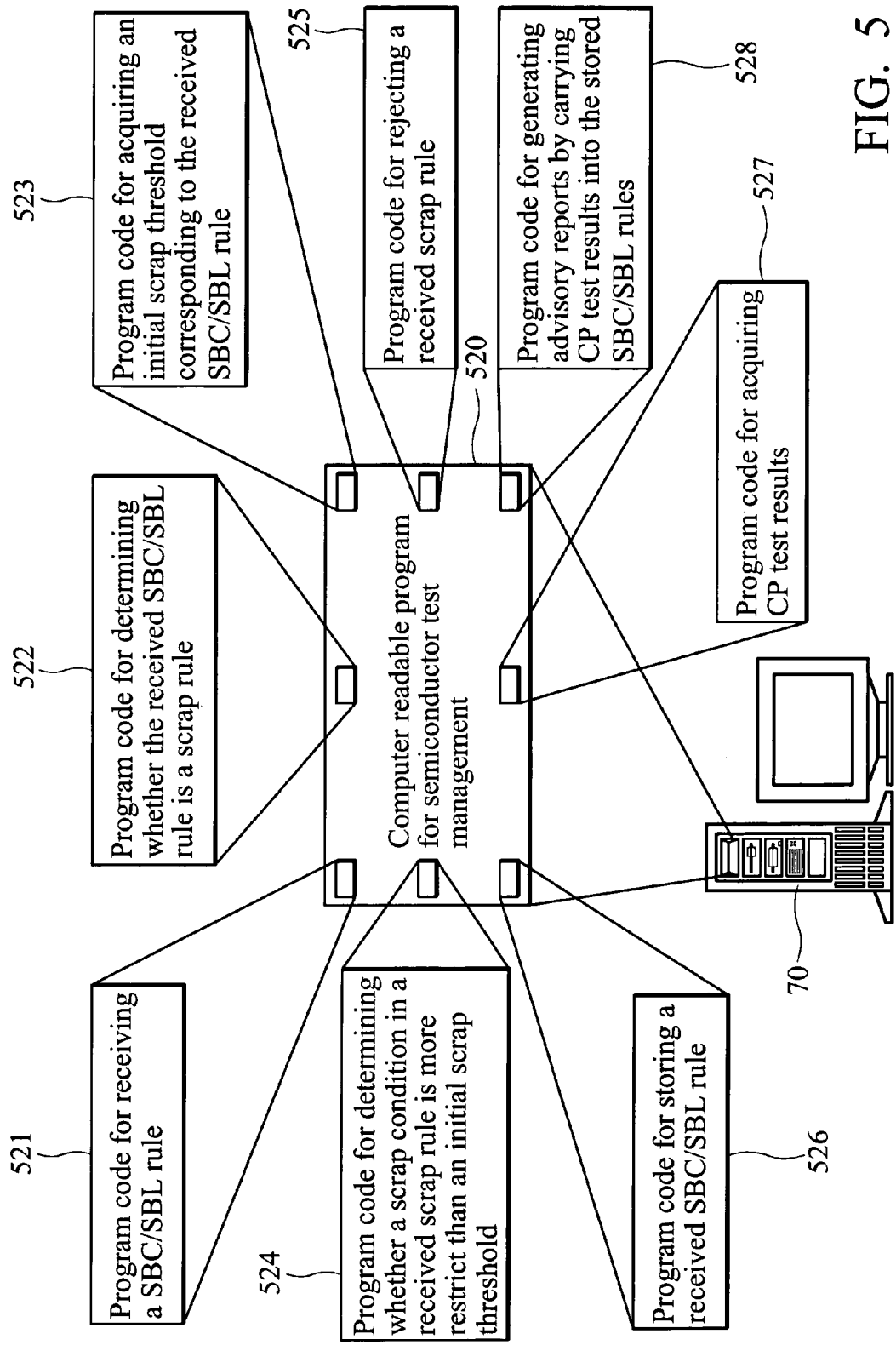
FIG. 5 is a diagram of a storage medium storing a computer program providing an embodiment of a method of semiconductor test management.

Also disclosed is a storage medium as shown in FIG. 5 storing a computer program 520 providing the disclosed method of semiconductor test management. The computer program product includes a storage medium 50 having computer readable program code embodied therein. The computer readable program code comprises at least computer readable program code 521 receiving a SBC/SBL rule, computer readable program code 522 determining whether the received SBC/SBL rule is a scrap rule, computer readable program code 523 acquiring an initial scrap threshold corresponding to the received SBC/SBL rule, computer readable program code 524 determining whether a scrap condition in a received scrap rule is more restrictive than an initial scrap threshold, computer readable program code 525 rejecting a received scrap rule, computer readable program code 526 storing a received SBC/SBL rule, computer readable program code 527 acquiring CP test results and computer readable program code 528 generating advisory reports by carrying CP test results into the stored SBC/SBL rules.

The methods and systems of the embodiments, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Although the present invention has been described in terms of preferred embodiment, it is not intended to limit thereto. Those skilled in this technology can still make various alterations and modifications without departing from the scope and spirit of this invention. Therefore, the scope of the present invention shall be defined and protected by the following claims and their equivalents.

What is claimed is:

1. A system for semiconductor test management, the system comprising:
   a rule provider providing a rule; and
   a computer receiving the rule from the provider, acquiring an initial threshold corresponding to the rule, determining whether a condition in the rule is more restrictive than the initial threshold, storing the rule when the condition is less or equally restrictive than the initial threshold, generating a rejection message when the condition is more restrictive than the initial threshold, acquiring a CP (Circuit Probing) test result for a wafer or wafer lot, and generating an advisory report for the wafer or wafer lot by carrying the CP test result into the stored rules, wherein a follow-up action is taken on the wafer or wafer lot when the CP test result for the wafer or wafer lot satisfies the condition in the rule.

2. The system of claim 1 wherein the computer receives the rule via an associated Web server and the rule provider transmits the rule via an associated Web browser.

3. The system of claim 1 wherein the rule received by the computer is a scrap rule, a hold rule, a downgrade rule, or a combination thereof, wherein the scrap rule determines whether the wafer or wafer lot is scrapped, the hold rule determines whether the wafer or wafer lot is held for analysis, and the downgrade rule determines whether the wafer or wafer lot is processed for low-end products.

4. The system of claim 1 wherein sorting of the wafer or wafer lot is enabled for subsequent process according to the advisory report.

5. The system of claim 1 wherein the rule provider and the computer communicate via Internet.

6. A system for semiconductor test management, the system comprising:
a SBC/SBL (Statistic BIN Control/Statistic BIN Limit) rule provider; and
a computer receiving a SBC/SBL rule from the SBC/SBL rule provider, determining whether the SBC/SBL rule is a scrap rule, acquiring an initial scrap threshold corresponding to the SBC/SBL rule when the SBC/SBL rule is the scrap rule, determining whether a scrap condition in the SBC/SBL rule is more restrictive than the initial scrap threshold, storing the SBC/SBL rule when the scrap condition is less or equally restrictive than the initial scrap threshold, generating a rejection message when the scrap condition is more restrictive than the initial scrap threshold, acquiring a CP (Circuit Probing) test result for a wafer or wafer lot, and generating an advisory report for the wafer or wafer lot by carrying the CP test result into the stored SBC/SBL rules,
wherein the scrap rule determines whether the wafer or wafer lot is scrapped when the CP test result for the wafer or wafer lot satisfies the scrap condition in the scrap rule.

7. The system of claim 6 wherein sorting of the wafer or wafer lot is enabled for subsequent process according to the advisory report.

8. The system of claim 6 wherein the computer determines whether the SBC/SBL rule is a hold rule or a downgrade rule and stores the SBC/SBL rule when the SBC/SBL rule is the hold rule or downgrade rule, the hold rule determines whether the wafer or wafer lot is held for analysis and the downgrade rule determines whether the wafer or wafer lot is processed for low-end products.

9. The system of claim 6 wherein the computer receives the scrap rule via an associated Web server and the rule provider transmits the scrap rule via an associated Web browser.

10. A method of semiconductor test management, comprising the steps of:
receiving a rule;
acquiring an initial threshold corresponding to the rule;
determining whether a condition in the rule is more restrictive than the initial threshold;
storing the rule when the condition is less or equally restrictive than the initial threshold;
generating a rejection message when the condition is more restrictive than the initial threshold; and
acquiring a CP (Circuit Probing) test result for a wafer or wafer lot and generating an advisory report for the wafer or wafer lot by carrying the CP test result into the stored rules,
wherein a follow-up action is taken on the wafer or wafer lot when the CP test result for the wafer or wafer lot satisfies the condition in the scrap rule.

11. The method of claim 10 wherein the rule is a scrap rule, a hold rule, a downgrade rule, or a combination thereof, wherein the scrap rule determines whether the wafer or wafer lot is scrapped, the hold rule determines whether the wafer or wafer lot is held for analysis, and the downgrade rule determines whether the wafer or wafer lot is processed for low-end products.

12. The method of claim 10 wherein the rule is stored as one of a plurality of SBC/SBL (Statistic BIN Control/Statistic BIN Limit) rules.

13. The method of claim 10 wherein sorting of the wafer or wafer lot is enabled for subsequent process according to the advisory report.

14. A method of semiconductor test management, comprising the steps of:
receiving a SBC/SBL (Statistic BIN Control/Statistic BIN Limit) rule;
determining whether the SBC/SBL rule is a scrap rule;
acquiring an initial scrap threshold corresponding to the SBC/SBL rule when the SBC/SBL rule is the scrap rule;
determining whether a scrap condition in the SBC/SBL rule is more restrictive than the initial scrap threshold;
storing the SBC/SBL rule when the scrap condition is less or equally more restrictive than the initial scrap threshold;
generating a rejection message when the scrap condition is more restrictive than the initial scrap threshold;
acquiring a CP (Circuit Probing) test result for a wafer or wafer lot; and
generating an advisory report for the wafer or wafer lot by carrying the CP test result into the stored SBC/SBL rules,
wherein the scrap rule determines whether the wafer or wafer lot is scrapped when the CP test result for the wafer or wafer lot satisfies the scrap condition in the scrap rule.

15. The method of claim 14 further comprising:
determines whether the SBC/SBL rule is a hold rule or downgrade rule; and storing the SBC/SBL rule when the SBC/SBL rule is a hold rule or downgrade rule,
wherein the hold rule determines whether the wafer or wafer lot is held for analysis and the downgrade rule determines whether the wafer or wafer lot is processed for low-end products.

16. The method of claim 14 wherein sorting of the wafer or wafer lot is enabled for subsequent process according to the advisory report.

* * * * *